United States Patent [19]
Mundinger et al.

[11] Patent Number: 5,520,244
[45] Date of Patent: *May 28, 1996

[54] MICROPOST WASTE HEAT REMOVAL SYSTEM

[75] Inventors: David C. Mundinger, Dublin; Donald R. Scifres, San Jose, both of Calif.

[*] Notice: The term of this patent shall not extend beyond the expiration date of Pat. No. 5,453,641.

[73] Assignee: SDL, Inc., San Jose, Calif.

[21] Appl. No.: 258,955

[22] Filed: Jun. 13, 1994

Related U.S. Application Data

[63] Continuation-in-part of Ser. No. 992,127, Dec. 16, 1992, abandoned, and a continuation-in-part of Ser. No. 93,206, Jul. 16, 1993, Pat. No. 5,453,641.

[51] Int. Cl.[6] .................................................. H01L 23/34
[52] U.S. Cl. ...................... 165/104.33; 257/712; 257/714; 361/700
[58] Field of Search .................................. 257/714, 712; 165/104.33; 361/700

[56] References Cited

U.S. PATENT DOCUMENTS

| | | | |
|---|---|---|---|
| 4,212,349 | 7/1980 | Andros et al. | 165/105 |
| 4,758,926 | 7/1988 | Herrell et al. | 361/385 |
| 4,881,237 | 11/1989 | Donnelly | 372/50 |
| 4,894,709 | 1/1990 | Phillips et al. | 357/82 |
| 5,005,640 | 4/1991 | Lapinski et al. | 165/170 |
| 5,046,840 | 9/1991 | Abbiss et al. | 356/28 |
| 5,105,429 | 4/1992 | Mundinger et al. | 372/34 |
| 5,126,829 | 6/1992 | Daikoku et al. | 357/82 |
| 5,131,233 | 7/1992 | Cray et al. | 62/64 |
| 5,179,500 | 1/1993 | Koubek et al. | 361/385 |
| 5,180,001 | 1/1993 | Okada et al. | 165/80.4 |
| 5,262,673 | 11/1993 | Mikoshiba et al. | 257/712 |

*Primary Examiner*—Rolf Hille
*Assistant Examiner*—T. M. Arroyo
*Attorney, Agent, or Firm*—Schneck & McHugh

[57] ABSTRACT

A cooling device formed in a thermally conductive substrate having a microstructure, such as a plurality of thermally conductive posts spaced apart by dimensions that induce capillary action in a liquid coolant. The posts extend away from the heated region and a space between the posts is supplied with liquid coolant which is contained by a meniscus near the tips of the posts. The coolant vaporizes at the meniscus and absorbs heat but, due to increased pressure in the coolant contained by the meniscus, does not boil within the space between the posts, allowing more liquid coolant contact with the thermally conductive substrate and posts. The vaporized coolant may be discharged into the air or into a chamber adjoining the tips having a lower pressure for removal of additional heat by gaseous expansion. The discharge of gaseous coolant allows the capillary flow of the liquid coolant in the space to be unimpeded, and the flow of liquid coolant may be augmented by a fluid pump. The gaseous coolant may be in thermal contact with a condenser that liquefies the coolant for supply to the space, by an array of capillaries, in a self contained cooling device. An array of such devices is provided with holes and stacked to connect adjacent liquid and gaseous coolant flows to cool an array of heated objects, such as laser diode bars.

23 Claims, 9 Drawing Sheets

MICROPOST WASTE HEAT REMOVAL SYSTEM

CROSS REFERENCE TO RELATED APPLICATION

This is a continuation-in-part of application Ser. No. 07/992,127 filed on Dec. 16, 1992, now abandoned, and Ser. No. 08/093,206 filed on Jul. 16, 1993, now U.S. Pat. No. 5,453,641.

TECHNICAL FIELD

The present invention pertains to cooling of heated regions. More particularly, the present invention relates to cooling of microelectronic devices such as laser diodes and cooling of arrays of such devices.

BACKGROUND ART

Excess heat is generated in many electrical and mechanical applications. Microprocessors, for example, may generate excess heat through internal electrical resistances. Mechanical devices such as those employing micro-machined gears and components also generate unwanted heat through friction between contacting surfaces. Heat produced by such systems can severely hamper the performance and reliability of the devices. In an attempt to alleviate the problem of excess heat generation, such devices are often soldered onto a heat sink formed of a thermally conductive material such as copper. Although heat sinks are somewhat effective in removing small amounts of heat, as the amount of heat produced is increased, the finite conductivity and diffusivity of the material used as a heat sink becomes a limiting factor. Even for the most thermally conductive materials such as diamond, the rate of heat transfer away from the device is not fast enough to keep up with the rate at which heat is produced. As a result, unacceptable temperature rises occur thereby limiting the performance and reliability of the device.

Microchannel cooling systems have been introduced which use a liquid such as water for cooling a heat source. In such systems, tunnels or grooves are formed into the substrate supporting the heat generating device. A liquid coolant, typically water, is then pumped through the tunnels in an attempt to remove excess heat generated by the device. These systems are designed to get the liquid coolant very close to the heat source, to further facilitate heat removal. However, the tunnels require a high pressure to maintain sufficient flow of the liquid coolant. As the number of tunnels is increased, and the corresponding size of the tunnels is decreased, the frictional forces on the coolant become substantial and, eventually, prohibitive. Furthermore, the performance of the system is still limited by the finite heat capacity of the water and the ability to get the heated coolant or vapor away from the heat source and fresh coolant into the region.

Heat pipes are also a well known method for providing system cooling. Heat pipe systems utilize a porous material such as sintered metal, ceramic, screens, or webbing as a wick to supply liquid coolant to the area from which excess heat is to be removed. The wick draws the coolant into the desired region through capillary pressure. As the coolant in the wick passes near the heat generating device, excess heat is absorbed through warming or, more commonly, vaporization of the coolant. Unfortunately, wick-type cooling systems also suffer from severe drawbacks. As the coolant in the wick is vaporized, increased pressure is created within the wick. The resultant pressure impedes the flow of new coolant through the wick and into the area where it is most needed. Additionally, the vaporized coolant tends to dry out the wick as it moves through it. Often, as the wick dries out, the temperature of the device rises substantially.

Therefore it is an object of this invention to provide for the efficient dissipation of heat from a heated region having the advantages of conventional microchannel and wick-type systems, but which does not have restricted or impeded flow of liquid coolant, and which does not dry out as quickly due to the flow of vaporized coolant through the system.

SUMMARY OF THE INVENTION

This object has been achieved with a compact heat dissipation device utilizing a microstructure formed in a thermally conductive substrate at a location near the heated region. The microstructure may be individual post members or members formed by the intersections of layers of parallel bars or holes in a bar having one or more microchannels. In general, the microstructure is a fluid path, a portion of which supports capillary action and allows formation of a meniscus. In the case of posts, the posts extend away from the heated object and are spaced apart an amount that induces capillary action, the space being continually supplied with a liquid coolant.

A meniscus forms in the microstructure, e.g. between adjacent posts and helps confine liquid coolant therein. Due to the size and arrangement of the posts, a pressure gradient is formed in the liquid coolant disposed in the space between the posts, such that the pressure near the heated region is substantially higher than the pressure further from the heated region, in the meniscus near tips of the posts. In addition, the thermal conductivity of the substrate allows heat to travel along the posts to provide a fairly even heating of the liquid coolant disposed in the space between the posts. Due to the combination of pressure gradient and the fairly even temperature distribution of liquid coolant within the space, the coolant is prevented from boiling at the high pressure region near the heated region, instead vaporizing only at the meniscus. The change of the coolant phase from a liquid to gaseous state absorbs a significant amount of heat from the heated region, transferring heat to the vapor, while preventing the liquid from boiling near the heated region allows the efficient conduction of heat and prevents the posts from drying out. The same is true for other microstructures.

The microstructure terminates into the air or into a voluminous chamber to which the gaseous coolant discharges. Cooling of the heated region or object is augmented by expansion of the gaseous coolant as it flows into the chamber, encouraged by a lower pressure in the chamber than near the meniscus. The pressure may be reduced in the chamber by a gas pump or by convection caused by a condenser in thermal communication with the chamber. The condenser is maintained at a temperature which liquefies the gaseous coolant in the chamber.

Although any means for supplying liquid coolant to be drawn by capillary action into the spaces between the posts and any separate means for discharging gaseous coolant from the chamber can be used with this device, a particular embodiment is disclosed which utilizes a second substrate which contains a plurality of passageways and which is bonded to the bottom of the first substrate such that a potion of the passageways are in fluid communication with the spaces. Liquid coolant is then provided via one or more of the passageways to the spaces, where it is disposed in close proximity to the heated region through capillary action induced by the microstructure. A preferred means of supplying liquid coolant involves an array of microchannels feeding fluid to the spaces that are proximate to the heated region. The coolant is vaporized from the meniscus in the spaces proximate to the heated region, and the vapor is vented from the spaces through one or more different, larger passageways. In so doing, a continuous flow of coolant is provided to the spaces and the vaporized coolant is removed through a different route so that the flow of coolant to the spaces is not impeded.

The heat dissipating devices can be used to cool devices such as laser diodes that are bonded to a thermally conductive substrate. Combinations of a laser diode, a thermally conductive substrate, and a second substrate can be stacked in arrays that are cooled using a single source of liquid coolant and a single repository for gaseous coolant.

As a result, the present invention provides for the dissipation of higher levels of waste heat than was previously possible. This in turn enables higher performance and increased reliability levels in the devices being cooled, such as laser diodes and laser diode arrays.

BEST MODE FOR CARRYING OUT THE INVENTION

Figure 1:
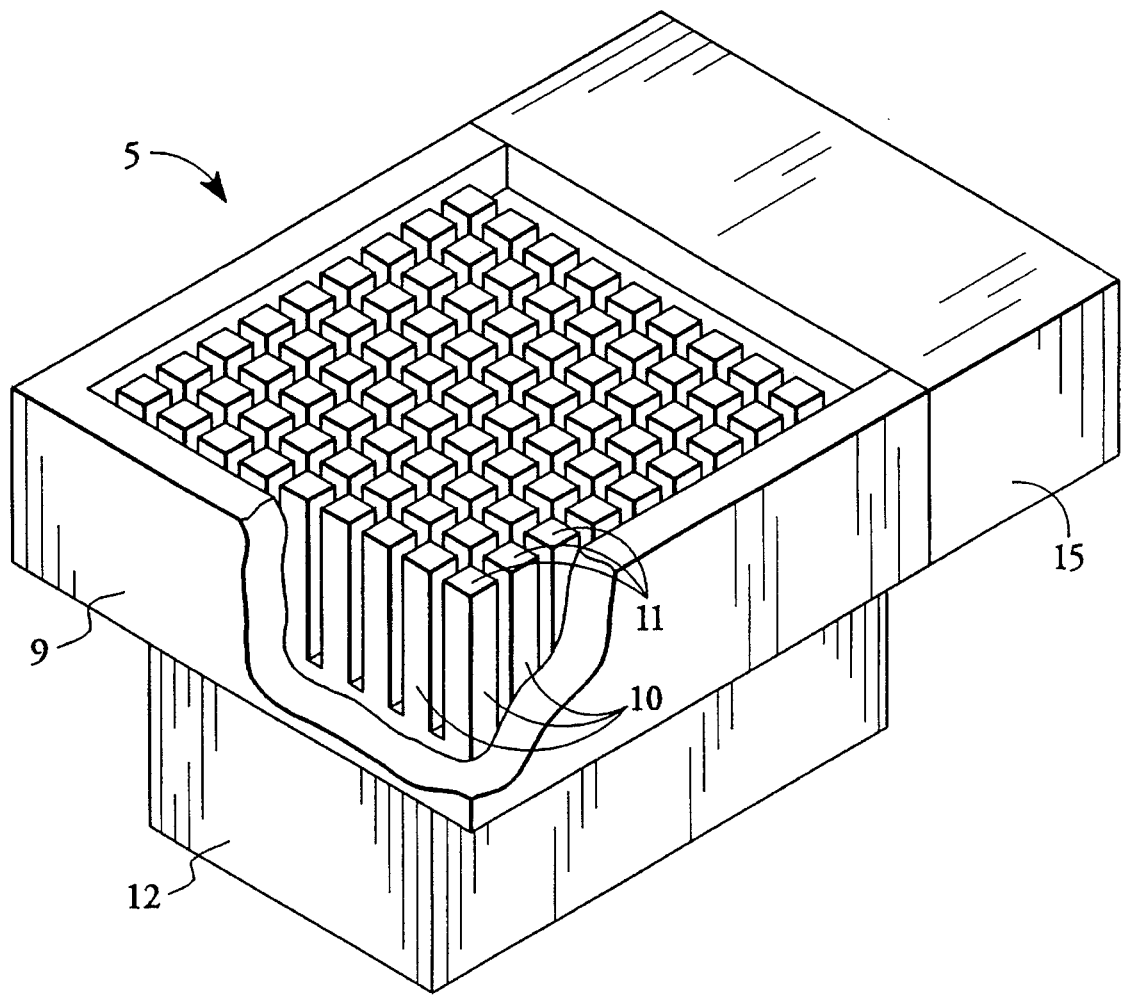
FIG. 1 is a cutaway perspective view of an open post microstructure cooling device of the present invention.

With reference to FIG. 1, an open cooling device of the present invention has a thermally conductive substrate 5 with an end wall 9 partially surrounding an array of thermally conductive posts 10 which extend in a direction away from a source of heat 12, each post 10 ending in a tip 11. A liquid coolant source 15 supplies a liquid coolant, not shown, to a space between the posts 10. The posts 10 are set apart from each other by a distance of about one mil or less, so that surface tension of the liquid coolant causes the coolant to be drawn between all of the posts 10 by capillary action. The liquid coolant tends to form a meniscus, not shown, near the tips 11. The liquid coolant vaporizes at the meniscus, removing heat from the liquid coolant and post 10, but is constrained from boiling within the space between the posts 10.

Figure 2:
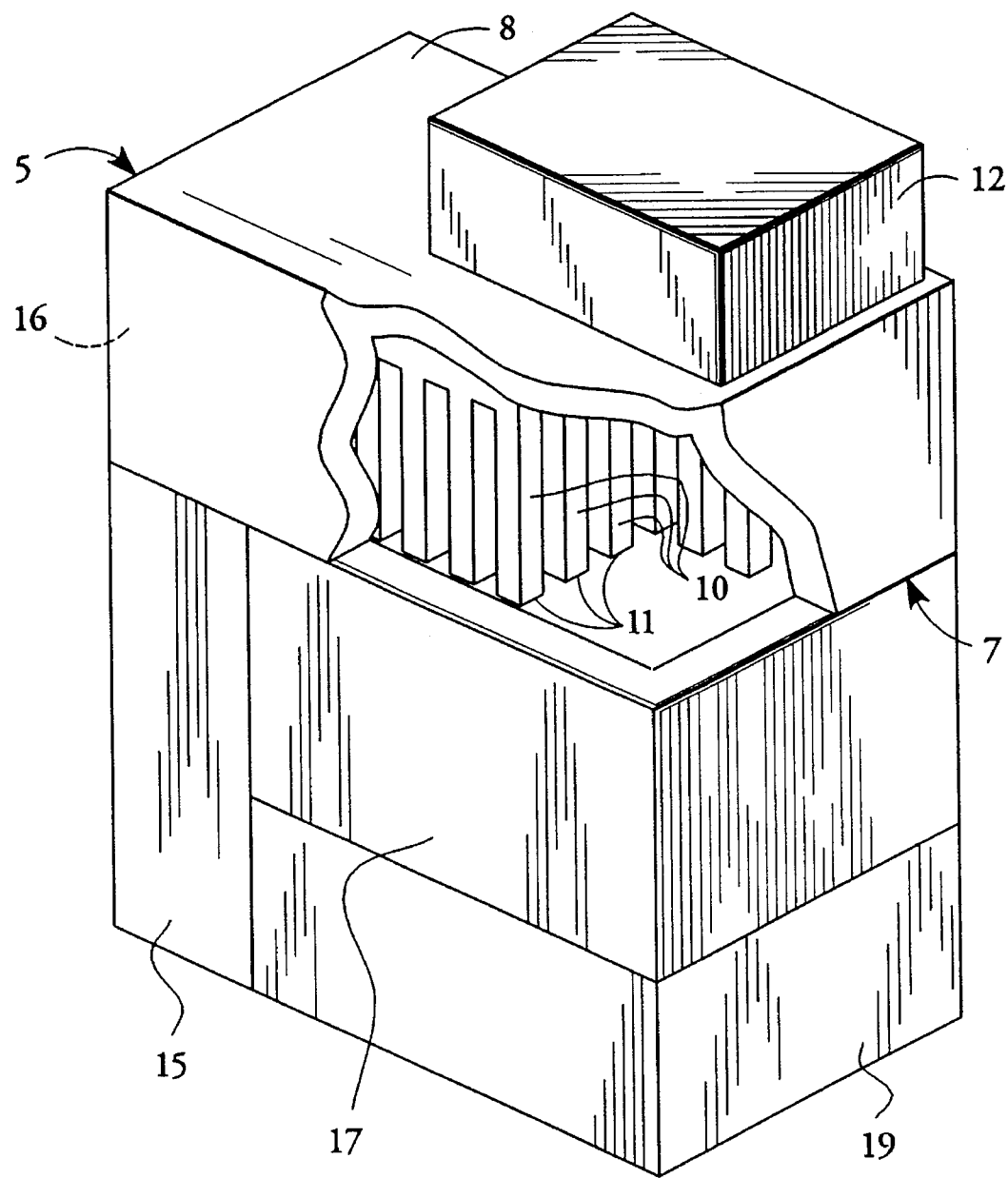
FIG. 2 is a cutaway perspective view of a closed post microstructure cooling device of the present invention.

In FIG. 2, a closed system employing the thermally conductive posts 10 is shown inverted with respect to FIG. 1. The posts 10 are elongated and have tips 11 at a bottom 7 of the substrate 5, while a top 8 of the substrate is disposed proximate to a source of heat 12. A fluid source 15 supplies liquid coolant, not shown, to one end 16 of the array of posts 10, and capillary action draws the coolant into a space between the posts 10. The exact form of the fluid source 15 is not essential to the invention. A chamber 17 for discharge of gaseous coolant, not shown, is adjacent the tips 11 of the posts 10. The exact form of the chamber 17 is not essential to the invention.

Vaporization of the coolant, aided by heat from the source of heat 12, occurs in the liquid coolant disposed within the space between the posts 10 at a meniscus, not shown, proximate to the tips 11, and the gaseous coolant is removed through the chamber 17. Boiling of the coolant within the space between the posts 10 is restrained by the arrangement of the posts 10 which induces capillary action. Since boiling of the coolant is inefficient, as it produces gas bubbles which reduce the amount of liquid coolant in close proximity to the source of heat 12, the lack of boiling within the space between the posts 10 adds to the cooling ability of the invention.

A condenser 19 may be placed in thermal contact with the gaseous coolant in the chamber, the condenser 19 causing the gaseous coolant to liquefy, the liquefied coolant providing coolant to the fluid source 15.

Another preferred embodiment of the invention, not shown, is identical to the embodiment described above, except that the fluid source 15 is in communication with the posts 10 at an end 18 of the array of posts 10 opposite to the end 16, and supplies liquid coolant to ends 16 and 18 simultaneously, while gaseous coolant is discharged from near the tips 11 and removed by a chamber 17 located between the ends 16 and 18.

The chamber 17 has a much larger volume than the space between the posts 10 in order to accommodate the expansion in volume of the coolant as it changes from a liquid to a gaseous phase. When the gas pressure in the chamber 17 is less than that in the space, as can be provided with a gas pump or with convection that occurs when the chamber is cooled and gaseous coolant liquefied by the condenser 19, the expansion in volume of the gaseous coolant from that near the tips 11 to that of the chamber 17 provides cooling of the gaseous coolant which carries away additional heat from the posts 10.

Figure 3A:
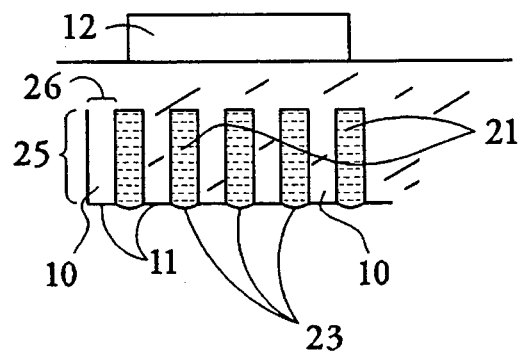
FIGS. 3a–d are cross-sectional views of posts and liquid coolant of the present invention.
Figure 3B:
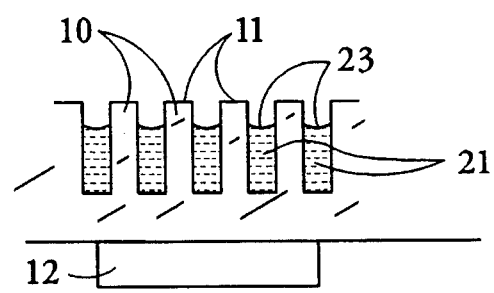

In FIG. 3a, posts 10 having a rectangular cross-section with tips 11 located below and a source of heat 12 located above, as in FIG. 2, are shown. Disposed within the spaces between the posts 10 is liquid coolant 21 having meniscuses 23 formed at the tips 11. Depending upon factors such as the materials used for the substrate 5 and the coolant 21, the heat flux and the spacing of the posts 10, the posts 10 may have a height 25 to width 26 aspect ratio of five or ten to one. The meniscuses 23 are rounded outward from the posts 10 due to a minimization of potential energies of gravitational and surface tension forces acting upon the liquid coolant 21. FIG. 3b shows similar posts 10, but inverted in position relative to the heat source 12, in which case the meniscuses 23 curve inward toward the heat source 12.

Figure 3C:
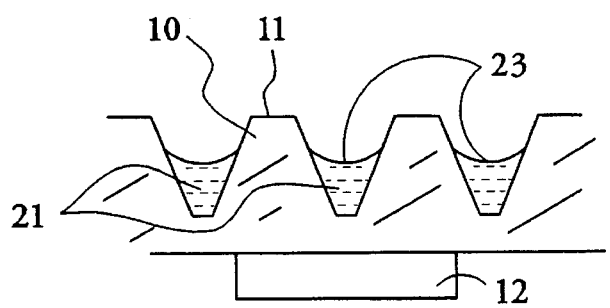
Figure 3D:
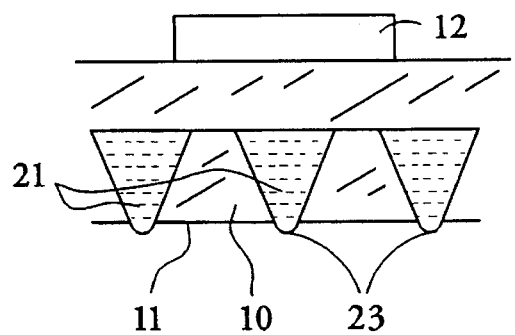

FIG. 3c shows a cross-section of posts 10 that are shaped as pyramids, with tips 11 that are smaller in width 26 than the rest of the posts 10, and having a source of heat 12 below. On the other hand, FIG. 3d shows posts 10 with tips 11 below and a source of heat 12 above, but these posts 10 have a splayed cross-section, with the tips 11 having the greatest width 26 of the posts 10. These variations are useful in increasing the cooling due to expansion of the gaseous coolant and may be produced, for example, by crystallographically selective etching of silicon substrate 5. The splayed posts of FIG. 3d may be produced by etching pyramidal cavities in silicon that end in an etch stop layer. It may also be useful to employ posts 10 projecting in a non-vertical direction, so that the force of gravity encourages coolant 21 flow between the posts 10.

The surface tension of the liquid coolant 21 is strong enough, given the small space between the posts 10, to provide the force which both draws the liquid coolant 21 between the posts 10 and contains it there, without regard to the direction the posts 10 project. The surface tension that confines the liquid coolant 21 between the posts 10 also pressurizes it. Within the meniscuses 23, however, the pressure is diminished, as the meniscuses are free from surface tension in a direction generally away from liquid coolant 21. It is well known that the boiling temperature of a fluid varies directly with pressure. Provided that the temperature in the space between the posts 10 is fairly uniform, the liquid coolant 21 will vaporize only at the meniscuses 23, due to the lower pressure and resultant lower boiling point found within the meniscuses 23. In other words, the boiling point gradient of the liquid coolant 21, due to the pressure gradient in the liquid coolant 21 between the posts 10, exceeds the temperature gradient of that coolant 21, causing the coolant 21 to vaporize only at the meniscuses 23.

The temperature within the coolant 21 is generally slightly lower further from the heated region, but posts 10 formed of a thermally conductive material such as silicon conduct heat so much better than a coolant such as water that the temperature gradient of the coolant 21 between the posts 10 depends primarily on the thermal conductivity of the posts 10. The temperature drop between the coolant 21 disposed closest to the heated region and that within the meniscus can be reduced by having either a more thermally conductive substrate 5 or shorter sides 27.

Figure 4A:
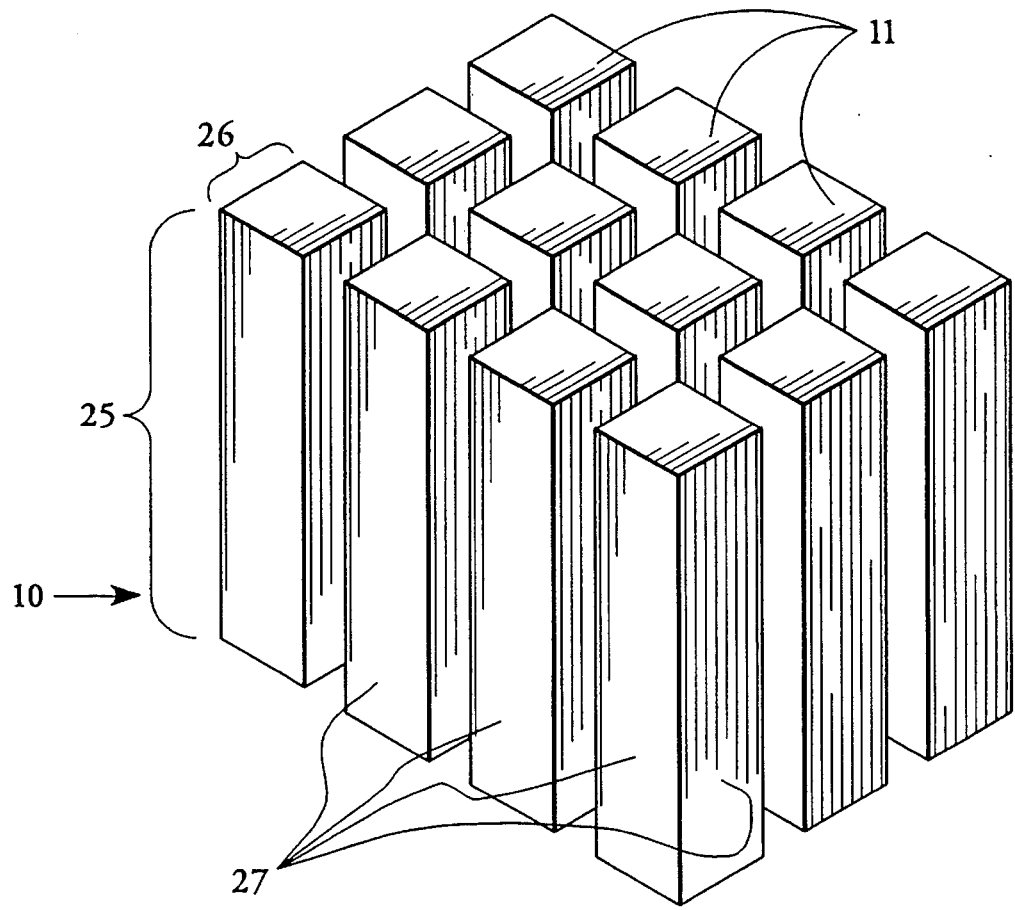
FIGS. 4a–c are perspective views of some of the posts of FIGS. 3a–d.
Figure 4B:
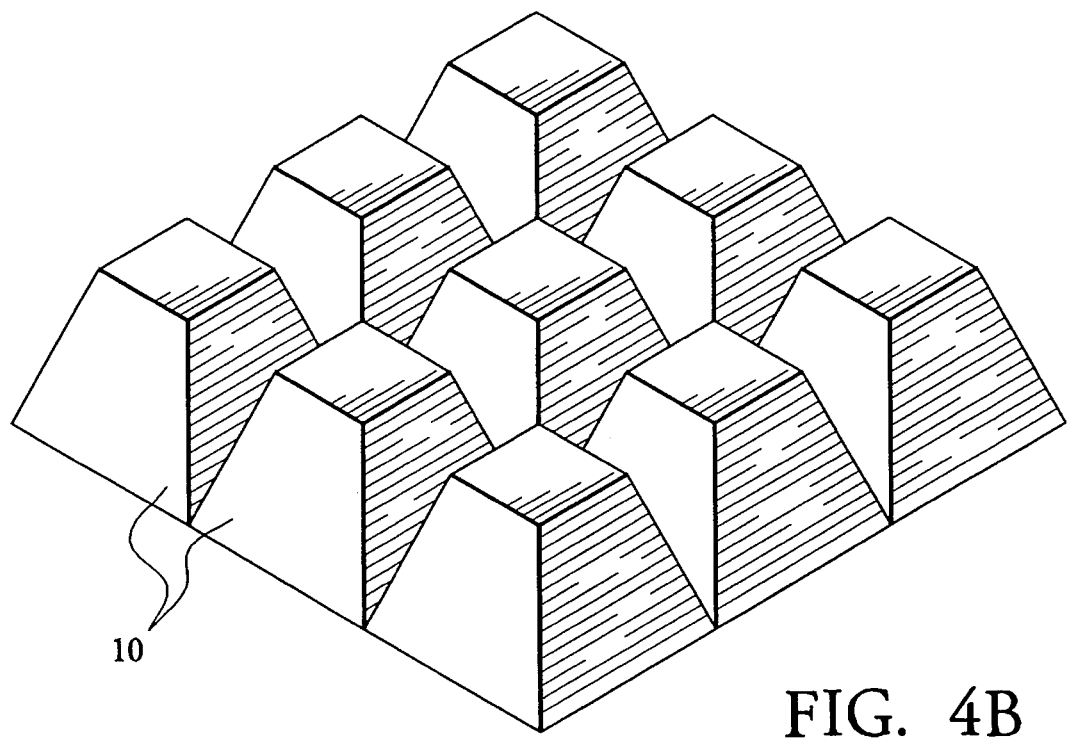

In FIG. 4a, some elongated cubical posts 10 having generally square tips 11 and elongated, rectangular sides 27 are depicted. These posts 10 can be seen to have a height 25 to width 26 aspect ratio of greater than five to one. A separation distance between adjacent posts 10 is preferably similar to the width 26, although the width 26 and the separation distance may differ by a factor of two. Both the width 26 and the separation distance between adjacent posts 10 may have dimensions in a range between 5 µm and 25 µm, the dimensions selected to provide optimal cooling for the particular coolant need and object being cooled. FIG. 4b shows an array of tapered or pyramidal posts 10, as may be fashioned by anisotropic etching of silicon.

Figure 4C:
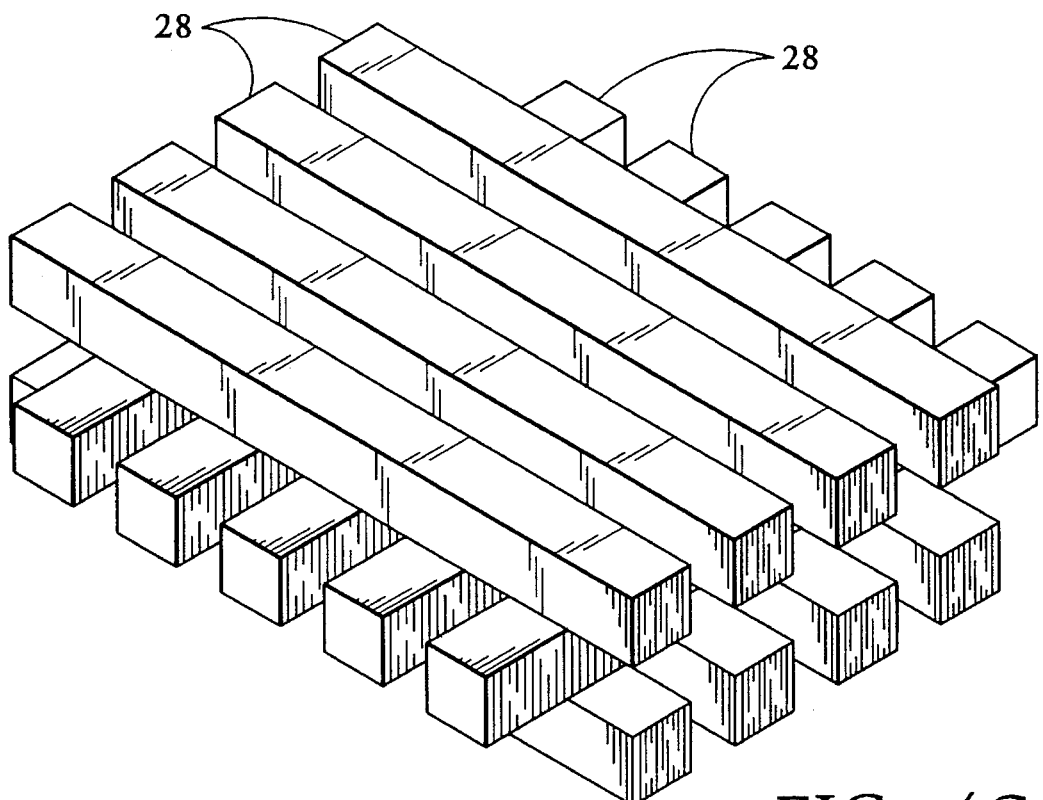

In FIG. 4c, a lattice of mostly copper bars or beams 28 is connected to provide a structure inducing cooling properties similar to the array of individual posts 10 described above. The beams 28 can be seen to be arranged in layers of parallel beams 29 that are oriented transversely to the beams 28 of adjoining layers. The distance between adjacent beams 28 in a layer is selected to be conducive to capillary action, and may be less than one mil. Connections between the beams 28 of adjoining layers are formed generally along lines extending away from the heated region, thus forming thermally conductive paths for conducting heat away from the heated region. The lattice of beams can be constructed by etching a row of parallel lines in a series of copper sheets, plating the etched sheets with silver, stacking the plated sheets with the lines of each sheet perpendicular to those of adjacent sheets but parallel with those of alternately spaced sheets, and heating the stack to a temperature at which a copper-silver eutectic is formed which, when cooled, forms thermally conductive connections between adjoining beams 28. This lattice can alternatively be oriented so that alternating layers of beams 28 extend away from the heated region like the posts 10, but with other beams 28 connected transversely to the post-like beams 28.

Figure 5:
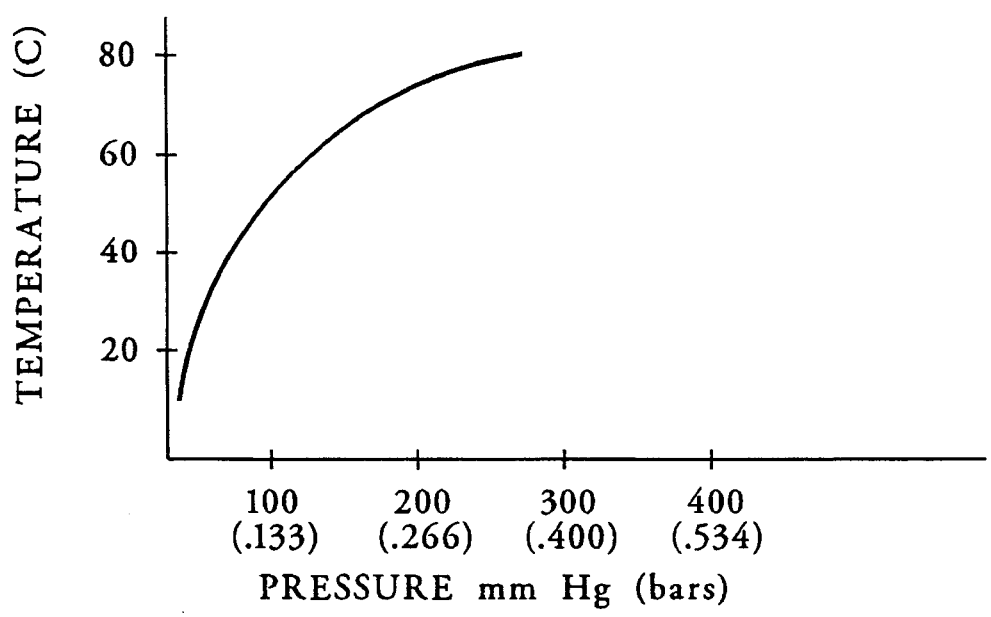
FIG. 5 is a chart of boiling point vs. pressure of water.

The chart of the boiling point vs. pressure of water, seen in FIG. 5, shows a steep slope at low pressures and a shallow slope as the pressure approaches atmospheric (1000 Bars). In order to have a large temperature difference between the boiling point of water in the meniscus 23 and that in the space between the posts 10 adjacent to the heated region 12 for a given drop in pressure at the meniscus 23, it is therefore advantageous to operate the device at low pressure. It may also be advantageous to operate the device at low pressure when water is used as the coolant so that phase change cooling takes place at a lower temperature, depending upon the range of temperature regulation desired.

Since the vaporization of coolant from the meniscus 23 will cause replacement coolant to be drawn into the space between the posts 10 via capillary action, the device acts to regulate temperature by beginning to flow and actively cool the heated region once the temperature in the meniscus 23 reaches the boiling point of the coolant disposed there.

Without the aid of a fluid pump, however, the heat flux that can be cooled by the device depends upon the flow of coolant 21 due to capillary action, which is caused by the surface tension of the coolant 21. The restriction on that flow is due to friction between the sides 27 of the posts 10 and the coolant 21 and the viscosity of the coolant 21. For this reason, it is advantageous for the coolant 21 to have a low viscosity and a high surface tension. It is preferable for the liquid coolant to have a viscosity of less than 0.007 poise, a surface tension of at least 70 erg/cm and a heat of vaporization of at least 200 Btu/lb. Fluids such as water, ammonia, freon, alcohol or any other fluid known in the art may be used. Surface tension is more effective at smaller distances, and thus the flow propelled by capillary action, or capillary pressure, increases as the space between the posts 10 is reduced. The pressure required to overcome friction between the sides 27 of the posts 10 and the coolant 21 and to cause coolant to flow also increases as the spacing between the posts 10 decreases, and increases with the length of the array of posts 10.

For moderate heat loads, self-pumped or capillary pumped cooling devices are attractive due to their simplicity. For cooling of larger heat loads that cover larger areas, external pumps may augment the flow induced by capillary action of liquid coolant and convection of gaseous coolant.

Figure 6:
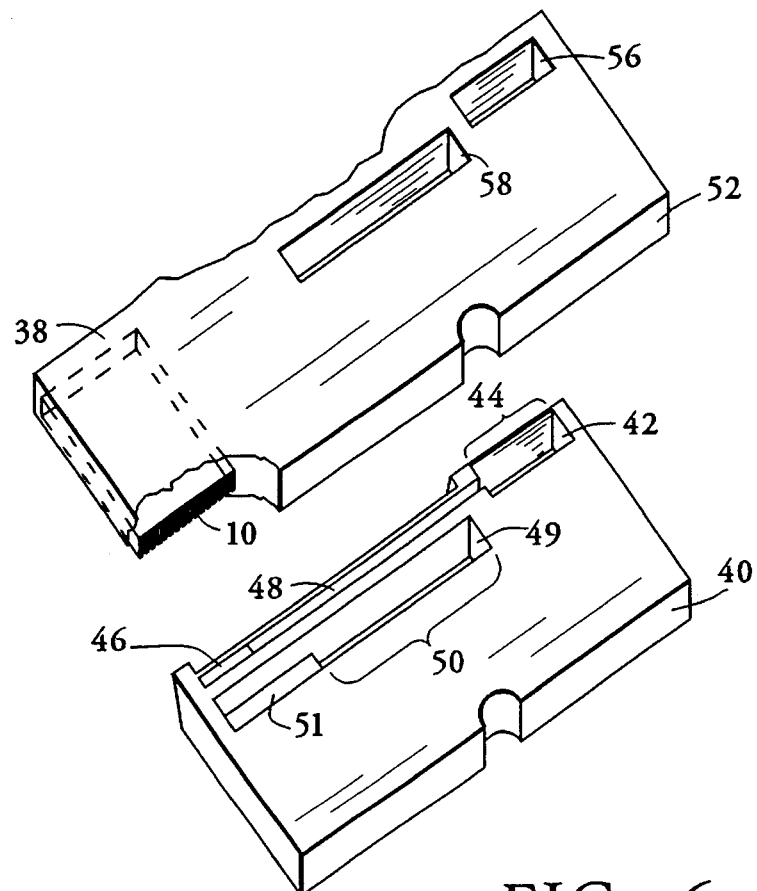
FIG. 6 is an exploded perspective view of an alternate embodiment of a cooling device in accord with the present invention.

Referring now to FIG. 6, an exploded perspective view of another preferred embodiment of the heat dissipation apparatus of the present invention is shown. A substrate 40, such as a silicon slice, has passageways 42 and 49 formed therein. Although silicon is used as the substrate in the preferred embodiment, any other well known substrate material would be suitable. Furthermore, although a thermally conductive substrate, silicon, is used in the preferred embodiment, substrate 40 may be formed of a non-thermally conductive material as well.

Passageways 42 and 49 may be formed into substrate 40 using a KOH etch, or any of the numerous etching or carving techniques well known in the art. Although passageways 42 and 49 are rectangularly shaped in the preferred embodiment, alternate shapes are also suitable with the methods of the present invention. Passageway 42, which functions as an inlet passageway, has a wide opening 44 at one end which passes completely through the bottom of substrate 40, and a capillary structure 46 at the other end.

Capillary structure 46 at one end of inlet passageway 42, is formed by carving a plurality of narrow channels into the top surface of substrate 40 which extend into but do not pass completely through substrate 40, the channels being approximately parallel to and in communication with passageway 42. The partitions of the substrate material, defining the narrow channels, are separated by distances which are sufficiently narrow such that a liquid may be maintained within region 46 through capillary action. Furthermore, because capillary structure 46 is used to hold liquid coolant through capillary action, and the rest of passageway 42 is used to deliver coolant, the narrow channels forming capillary structure 46 are much narrower than the channels used to form the rest of inlet passageway 42. The two ends of inlet passageway 42, wide opening 44 and capillary structure 46, are connected to each other through a slender channel 48 which, like the capillary structure 46 of passageway 42 does not pass completely through substrate 40. Slender channel 48 is formed of a single channel which is much larger than the channels used to form capillary structure 46.

Passageway 49, which is used as an outlet passageway, is formed in a manner similar to the way in which inlet passageway 42 was formed. Outlet passageway 49 has a wide opening 50 which is formed by carving an opening completely through substrate 40. Wide opening 50 is in communication with channel 51 of passageway 49. Channel 51, unlike opening 50, does not pass completely through substrate 40.

Outlet passageway 49 is formed having a much larger volume than inlet passageway 42. The larger volume of passageway 49 is necessary to accommodate the flow of vaporized coolant through outlet passageway 49. Because the coolant in a vaporized state occupies a larger volume than liquid coolant, outlet passageway 49 may be formed having a volume 100 times greater than the volume of inlet passageway 42.

Additional inlet and outlet passageways 42 and 49 may be formed periodically across the substrate 40 in order to ensure that a plentiful supply of coolant flows to the array of posts 10, and to insure that vapor is quickly removed. For example, two inlet passageways may be formed on substrate 40, and located such that one inlet passageway resides one each side of outlet passageway 49. Additionally, although opening 44 of inlet passageway 42 and opening 50 of outlet passageway 49 are formed through the bottom of substrate 40, openings 44 and 50 could be arranged differently if so desired. Additionally the size of openings 44 and 50 may be increased in size in order to allow an increased flow of liquid coolant and vapor, respectively.

A second substrate 52, which is formed of a thermally conductive substance such as silicon, has, on its surface, a region 38 heated by a heat producing device, not shown. Although the second substrate is formed of silicon in the preferred embodiment of the present invention, any one of numerous thermally conductive substrates well known in the art would be suitable. The second substrate 52 also has an array of posts 10 formed therein. The array of posts 10 is formed within substrate 52 in a similar manner to which capillary structure 46 of inlet passageway 42 was formed. Crossed channels are carved into the bottom of substrate 52 in the area under the heated region 38. The space between the posts 10 extends upward into the substrate 52 but does not reach the top surface. The posts 10 are separated by distances which are sufficiently narrow such that a liquid may be disposed within the array of posts 10 near heated region 38 through capillary action. The spaces between the array of posts 10 are aligned with the channels used to form capillary structure 46 of inlet passageway 42. In so doing, the liquid coolant will tend to spread along the array of posts 10 in a direction perpendicular to inlet passageway 42. Although only a single array of posts 10 is present in the preferred embodiment of the present invention, a plurality of such arrays 10 may be formed within substrate 52.

Substrate 52 is then bonded to the top of substrate 40 such that the region of capillary structure 46 of inlet passageway 42, and the portion of channel 51 of outlet passageway 49, proximate to capillary structure 46 of inlet passageway 42, are in fluid communication with array of posts 10 of substrate 52. The two substrates 40 and 52 may be fusion bonded, or joined through any other well known silicon processing technique. Further, when the substrates 40 and 52 are both formed of silicon, the flat spot commonly formed into silicon wafers may be used to precisely align the two substrates.

Liquid coolant is supplied and pumped through external means, not shown, to the opening 44 of inlet passageway 42. The coolant travels through slender channel 48 and is received by capillary structure 46. Capillary structure 46 holds the coolant through capillary action and, in so doing, acts to regulate the flow of coolant from inlet passageway 42 into array of posts 10. The liquid then spreads out along the posts 10 and is retained therein through capillary action. Although a pump is used to supply liquid coolant to inlet passageway 42 in the preferred embodiment of the present invention, other suitable supply means such as capillary action may also be used to supply coolant to inlet passageway 42. Whether a pump or capillary action is used to supply coolant to the space within the array of posts 10 is dependent upon several factors. These factors include the type of coolant used, the spacing between the posts 10 forming the array and the channels formed therein, and the amount of heat transferred into array of posts 10. If the demand for fresh coolant exceeds the rate at which coolant can be introduced into the array of posts 10 through capillary action, then a pump may be required.

The liquid coolant which is retained within the space between posts 10 is surrounded on three sides, such that the liquid coolant is held in close proximity to the heated region 38. That is, the liquid coolant is in contact with the top and the sidewalls of the channels only. Therefore, the liquid coolant is disposed within the channels such that one surface of the liquid coolant is exposed.

Excess heat generated by a device, not shown, and conductively transferred to heated region 38, heats and vaporizes the coolant which is held within the capillary structure of array of posts 10. As the coolant is vaporized, fresh coolant is supplied to the array of posts 10 through inlet passageway 42 through a pump, not shown. The pressure gradient created by the flow of additional liquid coolant into array of posts 10 causes the vaporized coolant passed from the exposed side of the liquid coolant to be vented through outlet passageway 49. In this manner, the flow of fresh liquid coolant into array of posts 10 through inlet passageway 42 is not impeded by the vaporized coolant produced by the coolant residing in the space between the posts 10. Likewise, the flow of vaporized coolant through outlet passageway 49 is unimpeded by the flow of liquid coolant into the array of posts 10 through inlet passageway 42. Furthermore, by venting the vaporized coolant through an outlet passageway 49 which is completely separate from an inlet passageway 42, the present invention does impede or dry out the path through which the incoming liquid coolant must flow.

In order to facilitate the removal of vapor, outlet passageway 49 may be maintained at a pressure less than inlet passageway 42 through external means. This may provide additional cooling due to expansion of the gaseous coolant 21 according to well known gas laws. The vapor exhausted through outlet passageway 49, may be vented into the atmosphere, or passed through a condenser where it may be condensed and recirculated to inlet passageway 42. Although outlet passageway 49 of the preferred embodiment is formed having a wide opening 50 in communication with a channel 51, alternate designs are possible. For example, an outlet passageway may be formed having only a single opening which, like opening 50 of outlet passageway 49, extends completely through substrate 40. The opening is then located such that when substrates 40 and 52 are bonded together, the opening is located directly under the array of posts 10. As coolant is vaporized at meniscuses formed between posts 10, the vapor passes through the opening in substrate 40 and into a condenser or is vented to the atmosphere.

Thus, as heat is conductively transferred into the liquid coolant and the coolant is heated, vaporization occurs at the exposed surface of the coolant. By passing from the exposed surface of the liquid coolant and out of the channels, the vaporized coolant does not continue to flow along with the liquid coolant through the channels. Thus, the vaporized coolant does not tend to dry out the space between the posts 10 or cause the temperature of the heated region 38 to rise as found in prior cooling systems.

Additional openings 56 and 58 may also be formed through substrate 52, when a stacked arrangement of substrates is desired. Opening 56 is arranged such that when substrates 40 and 52 are bonded together, opening 56 will reside directly over opening 44 of inlet passageway 50. Likewise, opening 58 is arranged such that it will reside directly over opening 50 of outlet passageway 49.

Figure 7:
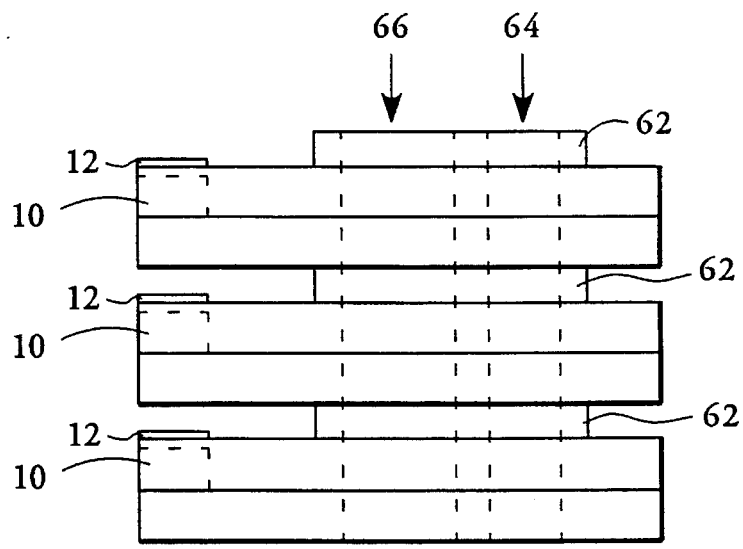
FIG. 7 is an elevated side view of the cooling device of FIG. 6 shown in a stacked and bonded array in accord with the present invention.

Referring now to FIG. 7, as successive substrate layers are stacked vertically, an elastomer gasket 62 having openings corresponding to openings 56 and 58 is placed between each assembly. In so doing, liquid coolant can be supplied to the array of posts in each layer, and the vapor can be removed from each layer through common corridors 64 and 66 corresponding to openings 56 and 58, respectively. Posts 10 are located proximate to heat sources 12, which may be laser diode bars. Thus, the cooling apparatus is suitable for either a single layered substrate system as shown in FIG. 5, or for multi-layered stacked systems as shown in FIG. 6. Furthermore, both of the above heat removal systems function using only a single external pumping/supply means and a single venting means.

Figure 8:
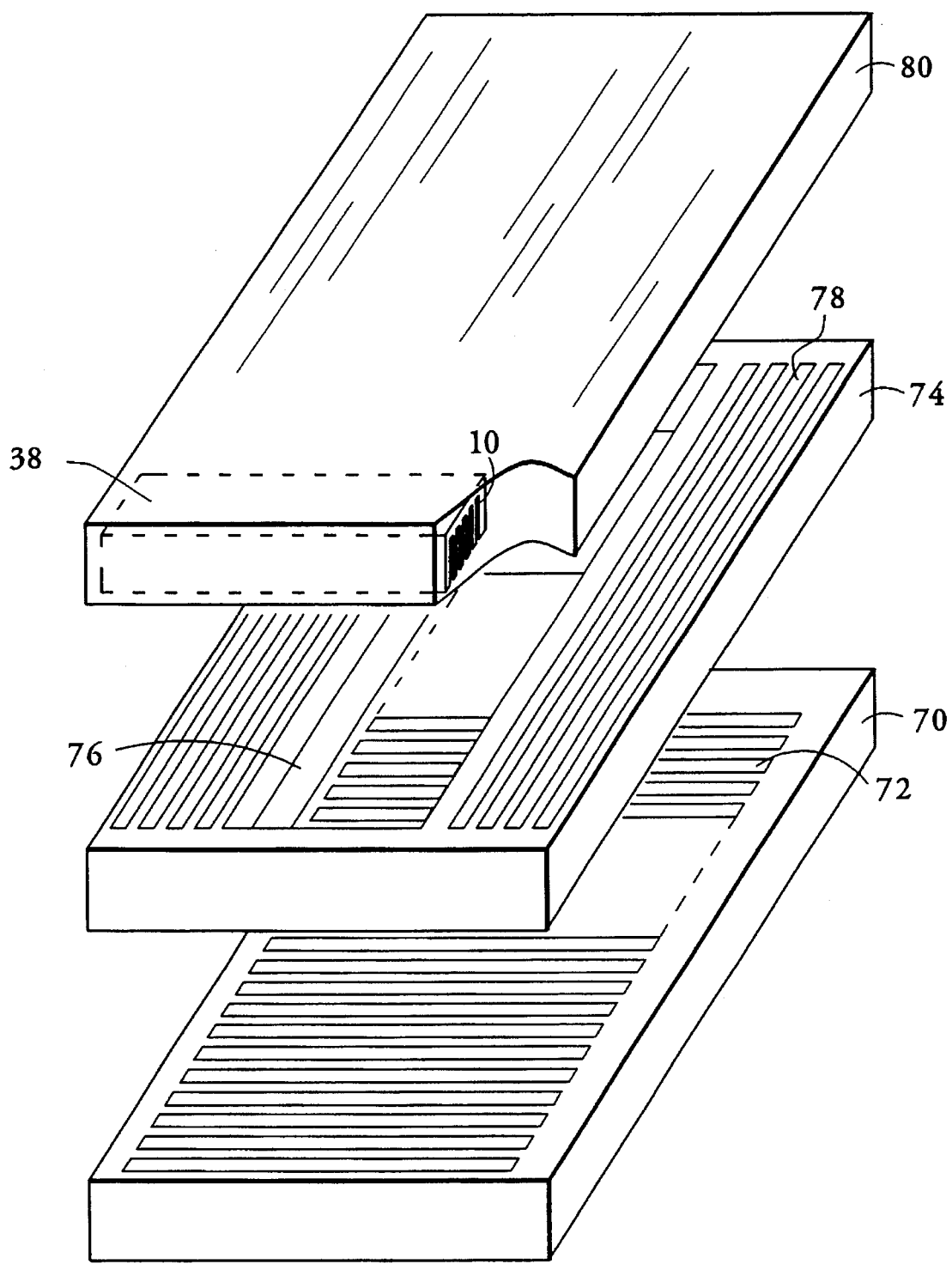
FIG. 8 is an exploded perspective view of another alternate embodiment of a cooling device in accord with the present invention.

With reference now to FIG. 8, an alternate embodiment of the present invention is shown in which a bottom substrate layer 70 is attached to a conventional heat sink, not shown. Narrow channels are formed into a large portion of the surface of substrate 70. The sidewalls 72 of the substrate material define the narrow channels as in the above-described preferred embodiment. The sidewalls 72 in the substrate 70 are separated by distances which are sufficiently narrow such that a liquid may be maintained therebetween through capillary action.

A middle substrate layer 74 has a central opening 76, and a series of narrow channels carved therethrough. The channels are carved into substrate 74, such that a capillary structure 78, as described above, is formed around opening 76 in a direction perpendicular to the alignment of sidewalls 72 in substrate 70.

A top substrate layer 80, having a heated region 38 residing on its top surface, is also shown in FIG. 4. Intersecting channels are carved into the bottom of substrate 80 in the area directly under the heated region 38. The channels extend into the substrate 80 but do not reach the top surface, forming an array of posts 10. The posts 10 are separated by distances which are sufficiently narrow such that a liquid may be maintained therebetween through capillary action. The capillary pressure will tend to keep the liquid coolant in between the posts 10, and the coolant will spread out between the posts 10 in a direction perpendicular to the sidewalls 78 formed in substrate 74.

A liquid coolant is introduced to the system, and the substrate layers 70, 74, and 80, are bonded together such that the liquid coolant is contained between the layers 70, 74, and 80, and such that the sidewalls of adjacent layers are in fluid communication. The capillary action existing between sidewalls 72, 78, and posts 10 of layers 70, 74, and 80, respectively, will supply liquid coolant into the area under the heated region 38 on top of layer 80. As excess heat is generated by the device, not shown, and transferred to the heated region, coolant contained between posts 10 will be vaporized. The vaporized coolant will flow from the posts 10 of layer 80, pass through the opening 76 in layer 74, and contact sidewalls 72 of layer 70. Since layer 70 is mounted to a heat sink, not shown, the sidewalls 72 will be maintained at a lower temperature than posts 10. As a result, the vapor will condense onto sidewalls 72 into liquid coolant which can again be supplied through capillary action to the space between posts 10 of layer 80 for additional cooling. Thus, a self-contained and fully enclosed system for cooling a heated region is disclosed which requires no external pumping, supplying, or venting means.

Figure 9:
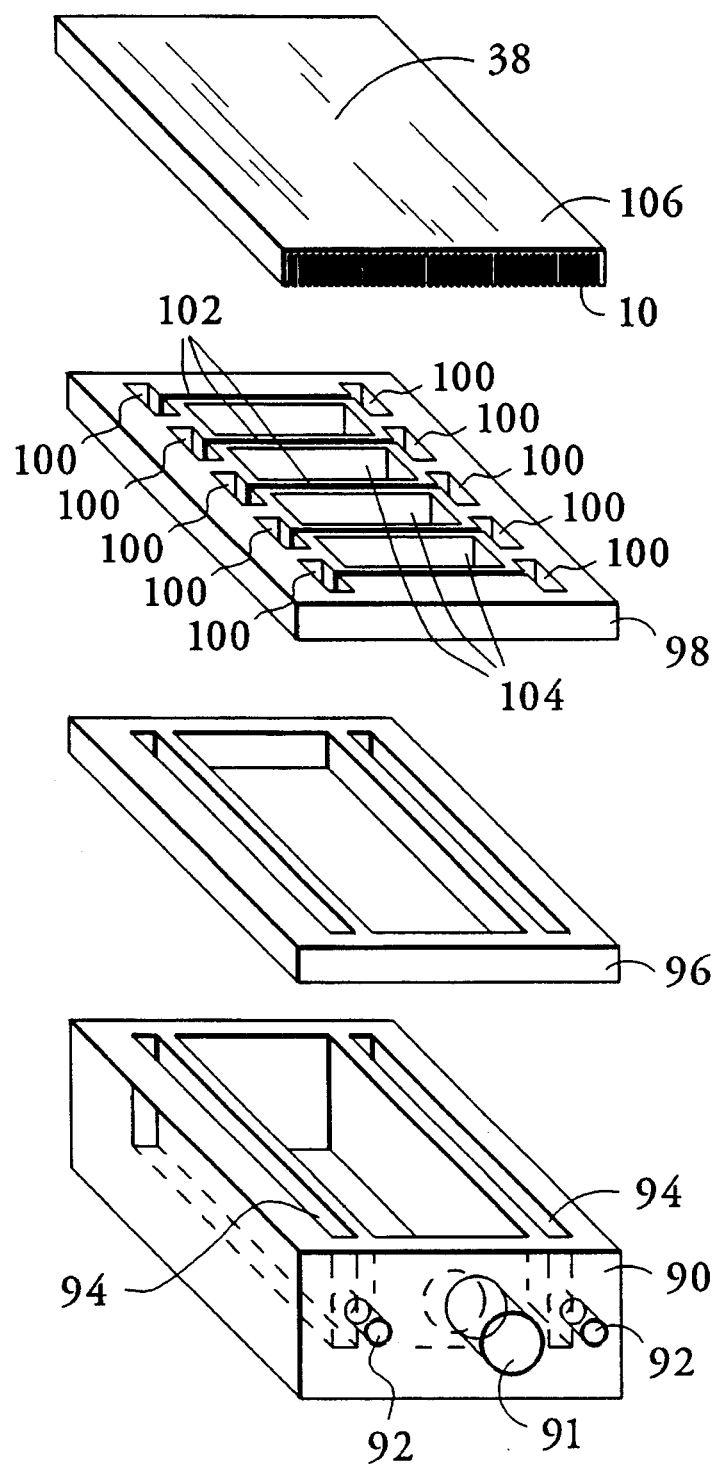
FIG. 9 is an exploded perspective view of yet another alternate embodiment of a cooling device in accord with the present invention.

Referring now to FIG. 9, an exploded view of another alternate embodiment of the present invention is shown. In this embodiment, liquid coolant enters housing 90 at input ports 92. The coolant is pumped through openings 94 in housing 90. An elastomer gasket 96 having openings corresponding to inlet openings 94 of housing 90 seals plate 98 to housing 90. Plate 98 has inlet passageways 100 which are on opposite sides of and in fluid communication with narrow grooves 102. Plate 98 also has exhaust openings 104 located in between narrow grooves 102. Coolant pumped upwards through inlet openings 94 passes through inlet passageways 100, and into narrow grooves 102. Coolant in narrow grooves 102 comes into contact with posts 10 formed into layer 106. The posts 10 of layer 106 are formed in the same manner as previous post structures described in detail above.

Excess heat generated by devices, not shown, and transferred to heated region 38 at or near the top surface of layer 106 heats and vaporizes the coolant maintained between posts 10. The vapor is then forced by pressure differences from the space between posts 10, through exhaust openings 104 and elastomer gasket 96 to outlet port 91 of housing 90.

Figure 10:
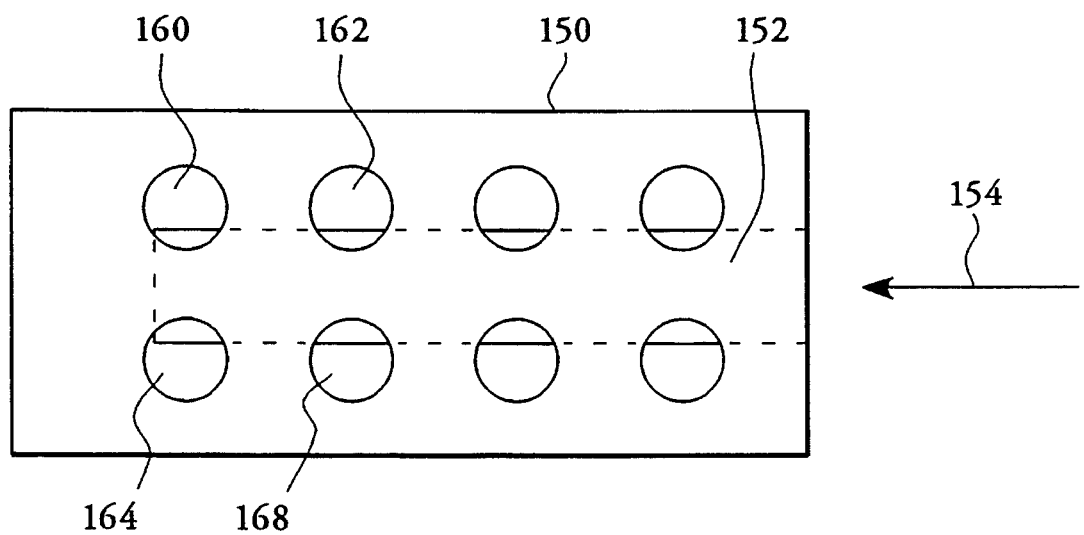
FIG. 10 is a top view of a bored block microstructure cooling device of the present invention.
Figure 11:
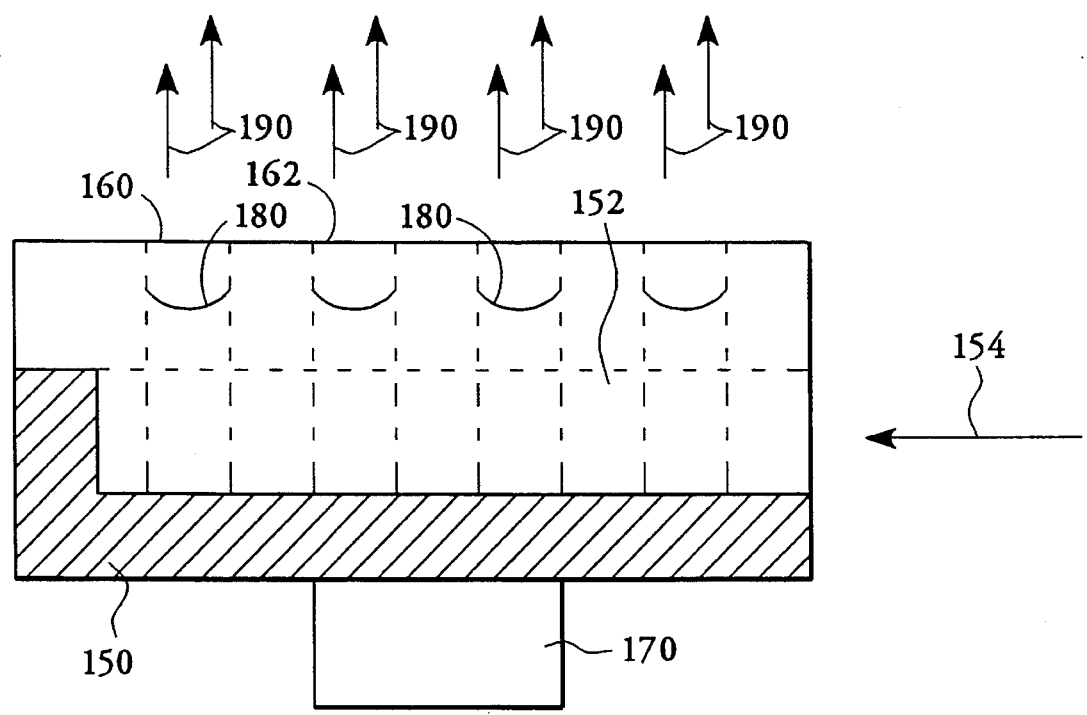
FIG. 11 is a side view of the device of FIG. 10.

With reference to FIGS. 10 and 11 a thermally conductive bored block 150, in contact with a heated body 170 has a plurality of microchannels therein, such as channel 152 which has dimensions which will support capillary action with respect to a cooling fluid. Cooling fluid may be supplied through a port indicated by arrow 154. A meniscus 180 forms in the capillary, but dimensions of the capillary keep the cooling fluid from boiling. Instead, the fluid vaporizes, as indicated by arrows 190, and is allowed to exit from the bored block through holes 160–168. As gas is removed from the vicinity of the holes, more fluid is supplied and drawn in to the bores of the block by means of capillary action.

We claim:

1. A thermal regulation device for cooling a heated region comprising:

a liquid coolant, a heat conductive body disposed in heat transfer relation with said heated region, said body having a microstructure which includes a fluid conduit for a liquid coolant, a portion of which supports capillary action, said liquid coolant disposed in a space in the microstructure adjacent to said heated region, said liquid coolant having a meniscus distal to said heated region, said microstructure and said meniscus restraining said liquid coolant from boiling in said space but allowing a phase change of said liquid coolant to a gaseous coolant near said meniscus, and a means for supplying said liquid coolant to said fluid conduit.

2. The device of claim 1 wherein said microstructure comprises a plurality of upright posts.

3. The device of claim 1 wherein said microstructure comprises a plurality of parallel bars in layers, each layer transverse of an adjoining layer.

4. The device of claim 1 wherein said microstructure comprises a bored block having at least one longitudinal bore at least a portion of which supports capillary action and a plurality of transverse bores intersecting the capillary to allow venting of fluid vapor from the longitudinal bore.

5. A thermal regulation device for cooling a heated region comprising:

a liquid coolant, a heat conductive body disposed in heat transfer relation with said heated region, said body having a plurality of heat conductive posts extending generally away from said heated region, said liquid coolant disposed in a space between said posts adjacent to said heated region, said posts arranged to induce capillary flow of said liquid coolant in said space with said liquid coolant having a meniscus distal to said heated region, said posts and said meniscus restraining said liquid coolant from boiling in said space but allowing a phase change of said liquid coolant to a gaseous coolant near said meniscus, and a means for supplying said liquid coolant to said space.

6. The device of claim 5 wherein said posts terminate distal to said heated region at a chamber, said chamber having a gas pressure lower than that near said meniscus, whereby additional heat is removed from said space due to expansion of said gaseous coolant.

7. The device of claim 1 further comprising means for discharging gaseous coolant further includes a condenser in thermal communication with said chamber, said condenser having a temperature inducing condensation of said gaseous coolant at said gas pressure of said chamber.

8. The device of claim 5 wherein most of said posts are substantially parallel with each other.

9. The device of claim 5 wherein said posts are tapered.

10. The device of claim 5 wherein said posts are pyramidal.

11. The device of claim 5 further comprising a plurality of lateral connections between said posts.

12. The device of claim 5 wherein said posts are defined along connections between transversely oriented bars.

13. The device of claim 1 wherein said liquid coolant has a low viscosity, a high surface tension and a high heat of vaporization.

14. The device of claim 1 further comprising a gas pump in gas flow communication with said chamber.

15. The device of claim 1 wherein said means for supplying said liquid coolant to said space includes a fluid pump having an outlet in fluid communication with said space.

16. A thermal regulation device for cooling a heated region comprising, a liquid coolant, a heat conductive body disposed in heat transfer relation with said heated region, said body at least partially formed by a plurality of heat conductive bars connected in a lattice structure, said liquid coolant disposed in a space between said bars adjacent to said heated region, said bars arranged such that said space induces capillary flow of said liquid coolant between said bars and said liquid coolant has a meniscus distal to said heated region, said bars and said meniscus restraining said liquid coolant from boiling in said space but allowing a phase change of said liquid coolant to a gaseous coolant near said meniscus, and a means for supplying said liquid coolant to said space.

17. The device of claim 16 wherein said bars are connected substantially along a line extending away from said heated region, such that a thermally conductive path extends from said heated region through said connected bars along said line.

18. The device of claim 16 wherein said bars are arranged in a plurality of layers, most of said layers having a plurality of mostly parallel bars, adjacent layers having bars aligned along different directions so that bars in adjacent layers intersect each other.

19. The device of claim 18 wherein said bars are connected substantially along a plurality of lines extending away from said heated region, such that heat conductive paths extend from said heated region through said connected bars along said lines.

20. The device of claim 16 wherein some of said bars extend away from said heated region.

21. The device of claim 16 wherein said body has a thermally conductive end wall disposed between said bars and said heated region.

22. Apparatus for cooling a heated body comprising, a heat conductive block, in thermal contact with the heated body, having a plurality of upright posts extending away from the heated body and terminating at open ends, the posts arranged in parallel rows with dimensions and spacing simulating microchannels which create capillary action in a cooling fluid and a meniscus at the open end, means for supplying a cooling fluid between the posts, the fluid matched to the simulated microchannels in a manner to resist boiling, the heated body and the heat conductive block having a temperature wherein the cooling fluid vaporizes without boiling thereby removing heat from the heated body.

23. Apparatus for cooling a heated body comprising, a heat conductive block, in thermal contact with the heated body, having a plurality of layers of generally parallel bars, the bars of adjacent layers intersecting to form upright posts extending away from the heated body and terminating at open ends, the bars having dimensions and spacing simulating portions of microchannels which create capillary action in a cooling fluid and a meniscus at the open end, means for supplying a cooling fluid between the bars, the fluid matched to the simulated microchannels in a manner to resist boiling, the heated body and the heat conductive block having a temperature wherein the cooling fluid vaporizes without boiling, thereby removing heat from the heated body.

* * * * *